(12) United States Patent
Raphaeli

(10) Patent No.: US 7,304,591 B2
(45) Date of Patent: Dec. 4, 2007

(54) METHOD AND SYSTEM FOR PROVIDING A DIGITAL SIGNAL REPRESENTING AN ANALOG SIGNAL

(75) Inventor: Dan Raphaeli, Kfar Saba (IL)

(73) Assignee: Sandlinks Systems Ltd., Tel Aviv (IL)

( * ) Notice: Subject to any disclaimer, the term of this patent is extended or adjusted under 35 U.S.C. 154(b) by 0 days.

(21) Appl. No.: 10/568,079

(22) PCT Filed: Aug. 11, 2004

(86) PCT No.: PCT/IL2004/000739

§ 371 (c)(1),
(2), (4) Date: Feb. 13, 2006

(87) PCT Pub. No.: WO2005/018130

PCT Pub. Date: Feb. 24, 2005

(65) Prior Publication Data

US 2006/0222128 A1    Oct. 5, 2006

Related U.S. Application Data

(60) Provisional application No. 60/494,575, filed on Aug. 13, 2003.

(51) Int. Cl.
*H03M 1/06* (2006.01)
(52) U.S. Cl. ...................................... 341/118; 341/161
(58) Field of Classification Search ................ 341/143, 341/144, 155, 118, 120, 161
See application file for complete search history.

(56) References Cited

U.S. PATENT DOCUMENTS

| | | | | |
|---|---|---|---|---|
| 4,873,702 A * | 10/1989 | Chiu | ........................ | 375/319 |
| 6,894,632 B1 * | 5/2005 | Robinson | .................... | 341/143 |
| 6,919,832 B2 * | 7/2005 | Brooks | ....................... | 341/143 |
| 6,980,139 B2 * | 12/2005 | Doerrer et al. | ............. | 341/118 |
| 6,989,714 B2 * | 1/2006 | Taura et al. | ................. | 330/251 |
| 7,057,540 B2 * | 6/2006 | Muhammad et al. | ....... | 341/143 |

* cited by examiner

*Primary Examiner*—Peguy JeanPierre
(74) *Attorney, Agent, or Firm*—Mark M. Friedman

(57) ABSTRACT

A method for providing a digital output signal (59) representing an analog input signal (54) in a system (50) including an analog circuit (51) and a control unit (52). Analog circuit (51) preferably features high bandwidth, high gain, and low current consumption. Analog circuit (51) is preferably implemented with low accuracy components. Control unit (52) keeps error outputs (55) of analog circuit (51) at a minimal value so that control unit (52) cancels analog input signal(54) by outputting discrete value signals (58) in a feedback loop as input (58) to analog circuit (51). A DSP (53) of system (50) is previously trained using known analog signals and a model relating inputs (54,58) to error outputs (55) of analog circuit (51) is previously known. During operation, a digital representation (57) of the discrete value signals (58) is fed to DSP (53) that reconstructs analog input signal (54) by knowing from the prior training the effect of control unit (52) and the model of analog circuit (51).

20 Claims, 8 Drawing Sheets

METHOD AND SYSTEM FOR PROVIDING A DIGITAL SIGNAL REPRESENTING AN ANALOG SIGNAL

CROSS REFERENCE TO RELATED APPLICATIONS

The present application is a national phase application under 35 U.S.C. 371 from international application PCT/IL2004/000739 filed on Aug. 11, 2004 which has priority from US provisional application 60/494,575 filed on Aug. 13, 2003.

FIELD AND BACKGROUND OF THE INVENTION

The present invention relates to analog signals sampling and, more particularly, to method and corresponding device for sampling at least one analog signal and providing digital representation thereof, featuring an analog circuit integrated with a control unit, wherein the control unit is keeping error outputs of the system at a minimal value. The control unit is using discrete value signals that are digitally feed to a DSP that is reconstructing the at least one analog input signal.

The present invention is primarily directed to applications requiring high bandwidth with low current consumption, including but not limited to applications of signal processing of analog sources in a variety of applications such as radar, imaging and analog front-end of wireless modem, including those using direct RF sampling.

The inputs to a previous art sampler are analog signal(s) and a clock or any other deterministic signal or signals. Previous art sampler is a system containing linear components, non-linear components, amplifiers, and optionally, delay elements and decision elements that output bits as function of its input, such as comparators or small analog to digital converters of 2 bits. The previous art sampler is designed to provide accurate conversion of each analog sample to its digital equivalent. Occasionally, the previous art sampler is calibrated in order to compensate for the inaccuracy of its components. More specifically, the gains and offsets of the previous art sampler are modified in order to achieve digital representation of the sampled analog signals featuring better accuracy. Alternatively, the previous art sampler includes calibration of its output in the digital domain.

Prior art samplers are described by models featuring multiple stages, wherein each stage in the model is independent from all other stages. In other words, models of prior art samplers are an aggregation of multiple models of each stage. Each stage in the model refers to specific voltage or current value that is measured in a specific time frame. Each stage treats the specific value it receives as an input and provides its result to the next stage. Moreover, prior art stage is not dependent on previous values.

SUMMARY OF THE INVENTION

In contrary to the previous art sampler, the method of the present invention does not disclose a sampler providing an accurate conversion of each analog sample to its digital equivalent, but the digital output of the sampler disclosed in the present invention features useful information from which the digital representation of the input analog signal can be calculated. Moreover, the sampler disclosed in the present invention is not calibrated in order to compensate for the inaccuracy of its components. More specifically, the gains and offsets of the sampler disclosed in the present invention are not modified in order to achieve digital representation of the sampled analog signals featuring better accuracy.

In other words, the method of the present invention discloses an analog circuit featuring high bandwidth, high gain, and low current consumption, wherein that analog circuit is implemented by low accuracy components. The analog circuit is integrated with a control unit. The control unit is keeping error outputs of the system at a minimal value so that the total effect of the control unit is canceling the effect of the input signals. By knowing the effect of the control unit, the input signals can be approximated. The control unit is using discrete value signals. These discrete value signals are feed to a DSP that is reconstructing the input signal by knowing the effect of the control unit.

In contrary to the various kind of previous art samplers, the sampler of the present invention is not made of sequence of separate stages, wherein each stage operates without memory and independently produces discrete value to the next stage. The sampler of the present invention features a unified model describing all the stages of the sampler. Moreover, in a case where it is useful to construct the sampler of the present invention from two or more stages, there are interconnections, and/or feedback or other dependencies between the various stages, which makes it necessary to use a unified model rather than independent model for each stage. Moreover, typically some or all of the stages models include the influence of previous values. Those novel interconnections between the models describing the sampler of the present invention are one of the reasons enabling the present invention to use the novel circuits described below and achieve its high performances.

Implementation of the method and corresponding device of the present invention involves performing or completing selected functions and/or tasks and/or steps and/or operations manually, semi-automatically, fully automatically, and/or, a combination thereof. Moreover, according to actual instrumentation and/or equipment used for implementing a particular preferred embodiment of the disclosed method and corresponding device, several selected functions and/or tasks and/or steps and/or operations of the present invention could be performed by hardware, by software on any operating system of any firmware, or a combination thereof. In particular, as hardware, selected functions and/or tasks and/or steps and/or operations of the invention could be performed by a computerized network, a computer, a computer chip, an electronic circuit, hard-wired circuitry, or a combination thereof, involving a plurality of digital and/or analog, electrical and/or electronic, components, operations, and protocols. Additionally, or alternatively, as software, selected functions and/or tasks and/or steps and/or operations of the invention could be performed by a data processor, such as a computing platform, executing a plurality of computer program types of software instructions or protocols using any suitable computer operating system.

BRIEF DESCRIPTION OF THE DRAWINGS

The present invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the present invention. In this regard, no attempt is made to show structural details of the present invention in more detail than is necessary for a fundamental understanding of the invention, the description taken with the drawings making apparent to those skilled in the art how the several forms of the invention may be embodied in practice. Identical structures, elements or parts which appear in more than one figure are preferably labeled with a same or similar number in all the figures in which they appear. In the drawings.

DESCRIPTION OF THE PREFERRED EMBODIMENTS

Figure 1:
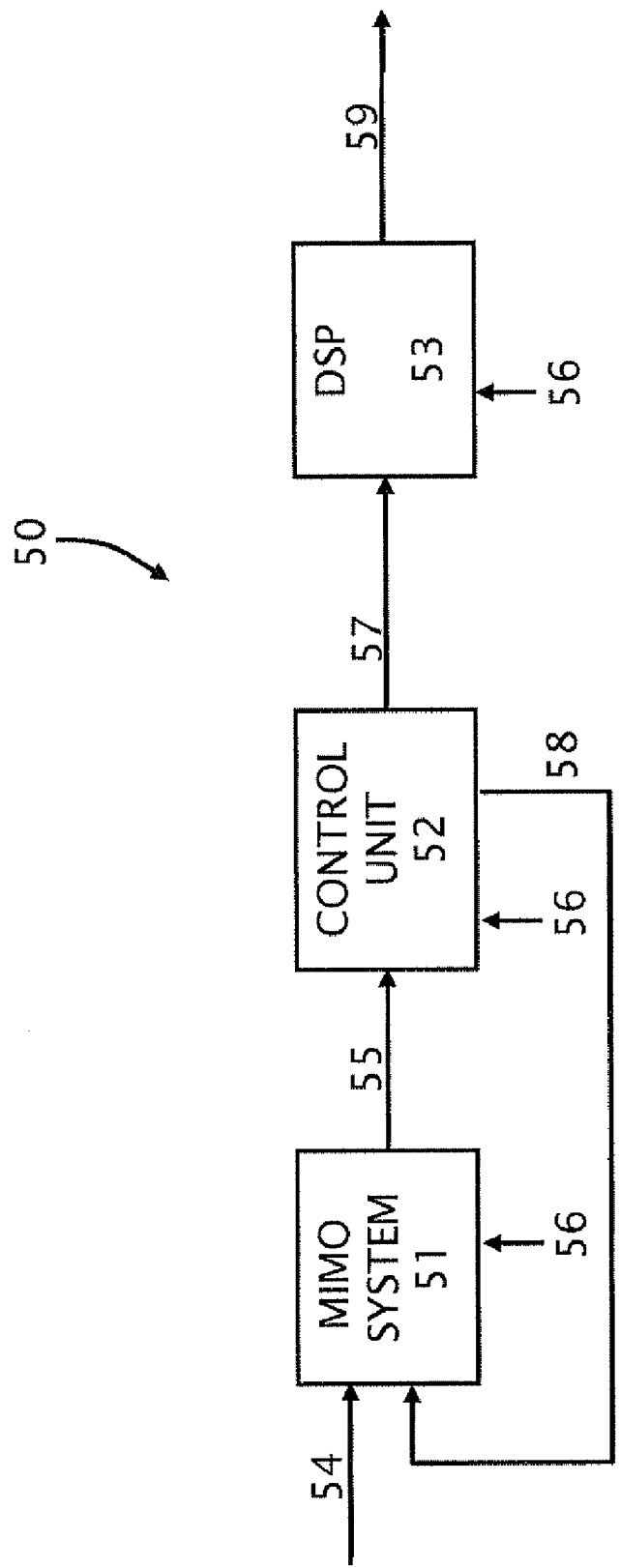
FIG. 1 is a schematic diagram illustrating the preferred embodiment of the generalized analog signals sampler of the present invention.

The present invention relates to analog signals sampling and, more particularly, to method and corresponding device for sampling at least one analog signal and providing digital representation thereof, featuring an analog circuit integrated with a control unit, wherein the control unit is keeping error outputs of the system at a minimal value. The control unit is using discrete value signals that are digitally feed to a DSP that is reconstructing the at least one analog input signal.

The present invention successfully addresses shortcomings and limitations of presently known methods for providing accurate conversion of analog sample to its digital equivalent, by being simpler, more rapid, and therefore, more cost effective, than currently used techniques for providing accurate conversion of analog sample to its digital equivalent. The method of the present invention is readily implemented using analog parts and digital parts. Analog parts are selected from: analog discrete parts, integrated circuit or RF components. The digital parts are selected from: discrete digital parts, integrated digital parts, mixed signal ASIC, or separate analog and digital ASICs. The digital part of the sampler of the present invention can also be implemented in a general purpose DSP or CPU. The general purpose DSP or CPU can be embedded, not embedded, or stand-alone computer (e.g. PC).

Moreover, the method and device of the present invention are generally applicable as a 'stand-alone' device for sampling analog signals and providing digital representation thereof, or, as a component used in combination with other methods, devices, and systems, using the sampled analog signals.

The present invention features a unique method, and a corresponding sampling device featuring high rate of sampling analog signals and providing digital representation thereof, with low power consumption. For example, a sampler in accordance with the present invention may consume average current in the order of 5 mili-Ampere (mA) when sampling an analog input signal featuring bandwidth of 50 MHz. This is in strong contrast to the previous art samplers consuming about 50-100 mA when sampling an analog input signal featuring the same bandwidth, when both implemented in the same device technology.

Another unique feature is that for high-speed signals the method of the present invention achieves better effective number of bits (ENOB), resulting in better precision, compared with the previous art samplers. This significant improvement is a result of the fact that the offsets, components inaccuracy, and unintentional delay in one clock wire relative to other wires distributing the same clock, known as clock skew, can be described by the general linear model and compensated by the adaptive algorithm described below.

Another unique feature of the method of the present invention is the high robust designing method, compensating all inaccuracies in the adaptive algorithm described below. Moreover, the sampler in accordance with the present invention can be easily scaleable through geometry changes in the technology of fabrication.

Still another unique feature of the sampler of the present invention is that the assembling blocks of the sampler are well available in most of the common low cost digital CMOS commercial fabrication processes and therefore do not require a special fabrication process and are easily incorporated in a mixed signal chip containing also large and complex digital blocks.

Still another unique feature of the sampler of the present invention is the high usable amplitude range (dynamic range) of the analog input signal. The high dynamic range is achieved by the non-obvious structure of the sampler of the present invention, rarely found on previous art samplers, designed such that the Signal to Noise Ratio (SNR) is almost independent on the average signal power within the required dynamic range. For example, an input analog signal featuring average RMS of 1 mili volt (mV) may be sampled by the sampler of the present invention with SNR=48 dB, while feeding the same sampler with an input analog signal featuring average RMS of 100 mV may also be sampled with SNR=48 dB, given these two input analog signals feature the same statistical distribution.

Still another unique feature of the sampler of the present invention is the ability to sample low power signals. This significant feature is a result of the low self-noise of the sampler of the present invention. The low self-noise of the sampler of the present invention is a result of its very low power operation, creating less noise contaminating the input signal. Moreover, most of the noise created by the sampler of the present invention, contaminating the input signal or the intermediate signals, can be incorporated into the model and compensated for.

Still another unique feature of the sampler of the present invention is its low price resulting from the very small footprint needed for implementation, and the fact that the building blocks are simple, inaccurate, and consume low power.

It is to be understood that the present invention is not limited in its application to the details of the order or sequence of functions and/or tasks and/or steps and/or operations or implementation of the method for sampling analog signals and providing digital representation thereof or to the details of construction, arrangement, and, composition of the corresponding analog signals sampler thereof, set forth in the following description, drawings, or examples. The present invention is capable of other embodiments or of being practiced or carried out in various ways. Moreover, it is to be understood that the phraseology, terminology, and, notation, employed herein are for the purpose of description and should not be regarded as limiting. Moreover, the method and corresponding sampler of the present invention can be implemented in a variety of configurations, for example, Multi Input Multi Output (MIMO) system 51 and control unit 52 illustrated in FIG. 1, may be of variable configuration, including, but not limited to, multi-stage implementation, as illustrated for example in FIG. 4, or iterative implementation using one stage and feedback.

Throughout the following description and accompanying drawings there is first provided description of the preferred embodiment of the generalized method and corresponding analog signals sampler of the present invention, followed thereafter by detailed descriptions and illustrations of two different exemplary preferred embodiments of the generalized method and corresponding analog signals sampler of the present invention.

The preferred embodiment of the generalized method and corresponding analog signals sampler of the present invention is illustrated in FIG. 1. The preferred embodiment of the generalized method and corresponding analog signals sampler is readily extendable and applicable to the following description of two exemplary preferred embodiments of the generalized method and corresponding analog signals sampler of the present invention.

Figure 4:
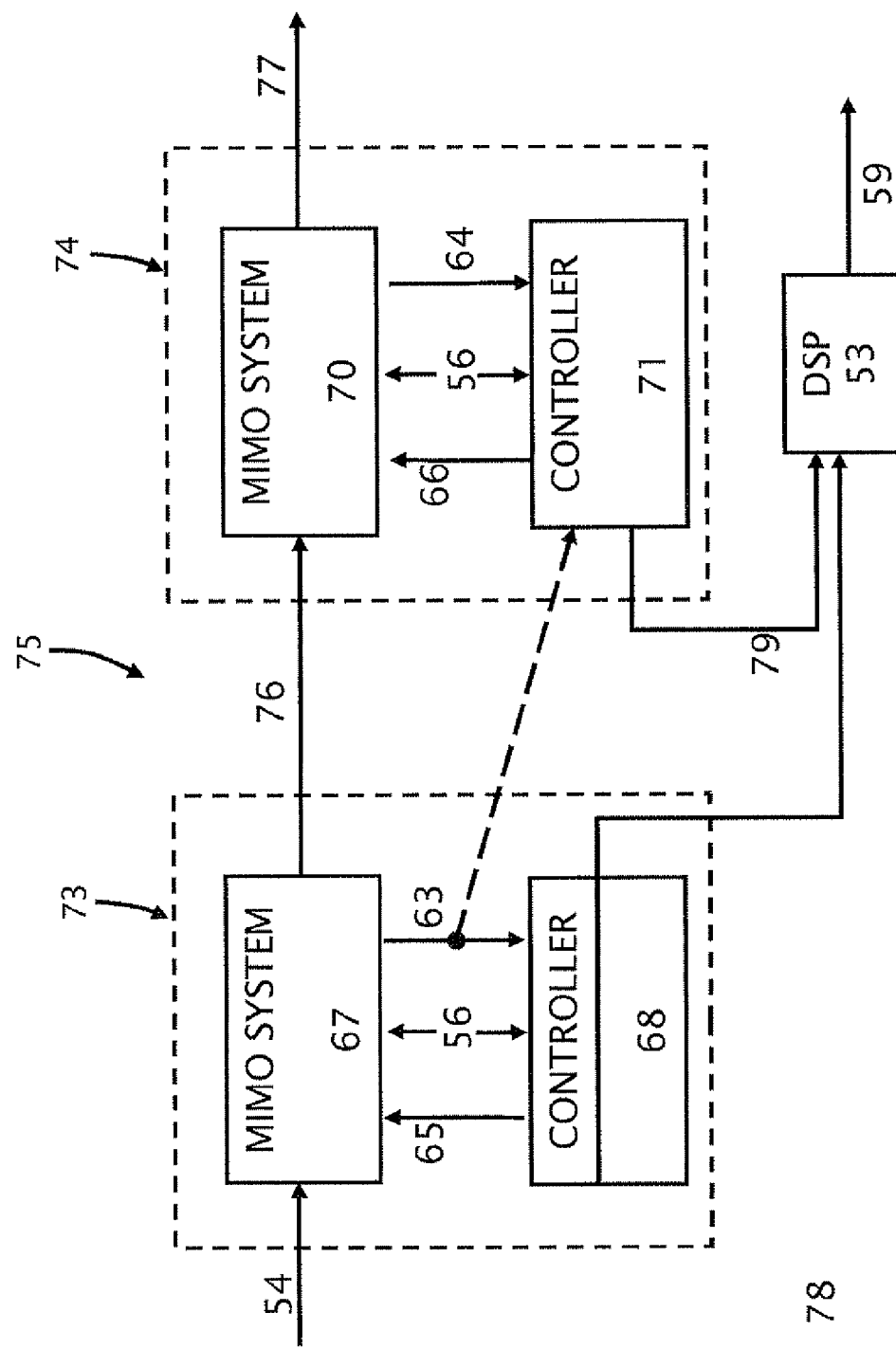
FIG. 4 is a schematic diagram illustrating the first multi-stage exemplary preferred embodiment of the generalized method and corresponding analog signals sampler of the present invention.

The first exemplary preferred embodiment of the generalized method and corresponding analog signals sampler of the present invention, relates to a multi-stage type configuration of the sampler disclosed in the preferred embodiment of the generalized method, whereby Multi Input Multi Output (MIMO) system 51 and control unit 52 are implemented in two exemplary stages. Each stage features a MIMO systems and a controller, as illustrated in FIG. 4. It is to be understood that the multi-stage sampler in accordance with the present invention can be easily scaleable through duplications of its stages, as is well known in the art of electronic hardware design.

Figure 7:
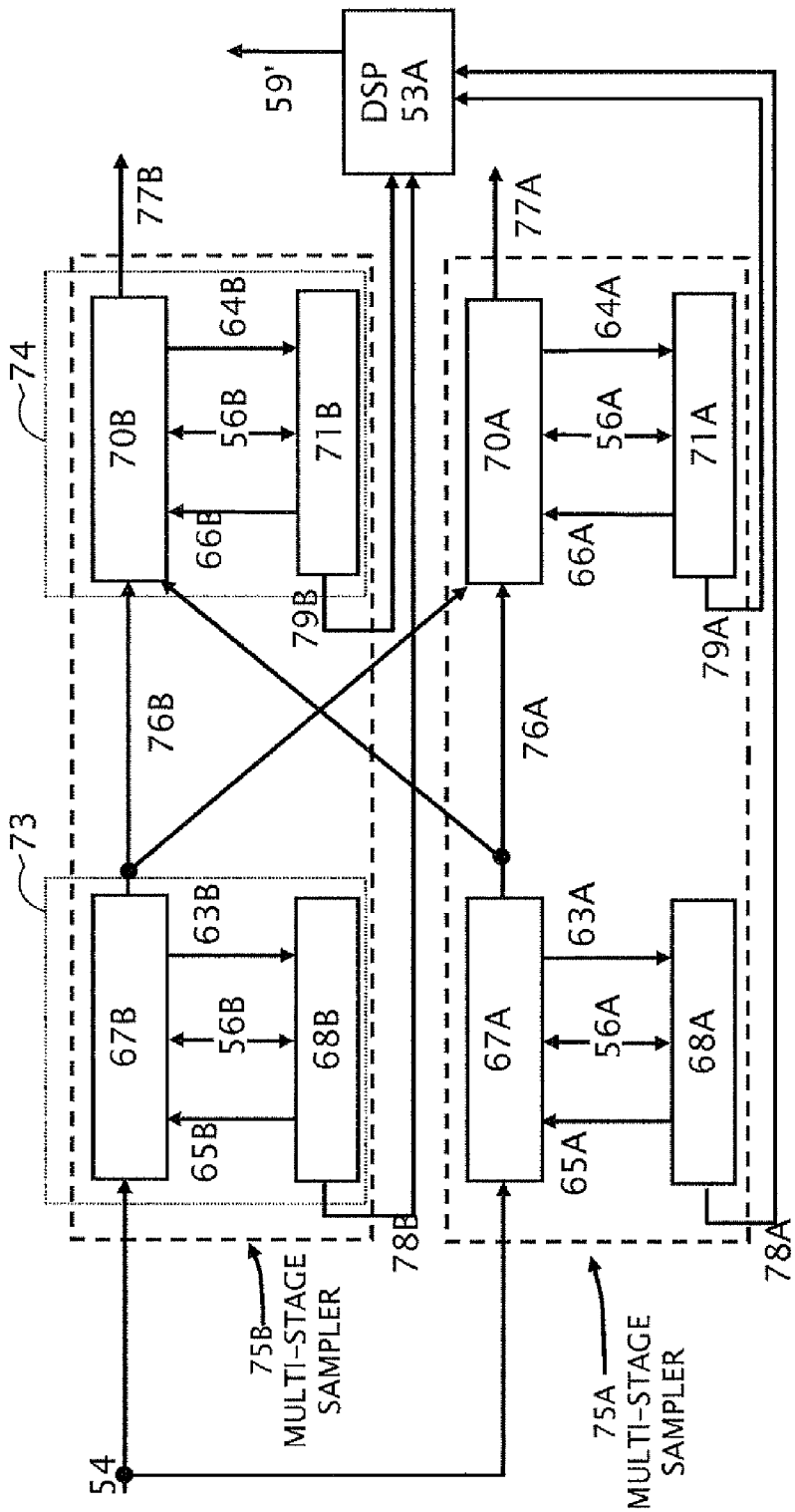
FIG. 7 is a schematic diagram illustrating the second multi-stage exemplary preferred embodiment of the generalized method and corresponding analog signals sampler of the present invention.

The second exemplary preferred embodiment of the generalized method and corresponding analog signals sampler of the present invention, relates to a similar multi-stage type configuration of the first exemplary set, but, here, there are plurality of multi-stage samplers sampling the same analog input signal, as illustrated in FIG. 7.

For each set of exemplary preferred embodiments, the multi-stage sampler in accordance with the present invention has a scalability capability to increase its resolution through increasing the number of stages. It is to be understood that even though the resolution can be increased unlimited, the actual ENOB is limited by noise and other factors. Therefore, adding additional stages, once the maximal SNR has been achieved, does not improve performance, unless the dynamic range needs to be increased. The exemplary preferred embodiments illustrate two stages sampler, but it should be understood that a resolution of more bits is implemented with the addition of stages. In other words, it should be understood that the sets of exemplary preferred embodiments illustrate only two stages out of many more implemented in a representative exemplary sampling device in accordance with the present invention.

In the following description of the method of the present invention, included are only main or principal functions and/or tasks and/or steps and/or operations needed for sufficiently understanding proper 'enabling' utilization and implementation of the disclosed method and device for sampling analog signals and providing digital representation thereof. Accordingly, descriptions of the various required or optional minor, intermediate, and/or, sub functions/tasks/steps/operations, which are readily known by one of ordinary skill in the art, and/or, which are available in the prior art and technical literature relating to the field of sampling analog signals, are not included herein.

Functions and/or tasks and/or steps and/or operations and/or, components, and/or implementation of the method and corresponding device for sampling analog signals and providing digital representation thereof, according to the present invention, are better understood with reference to the following description and accompanying drawings.

The preferred embodiment of the generalized method for sampling analog signals and providing digital representation thereof, in accordance with the present invention, is described herein. Referring now to the drawings, FIG. 1 is a schematic diagram illustrating the preferred embodiment of the generalized analog signals sampler of the present invention.

In FIG. 1, the device for sampling at least one analog signal and providing digital representation thereof, hereinafter, referred to as sampler 50, features the following primary components: (a) Multi Input Multi Output (MIMO) system 51, (b) control unit 52, and (c) Digital Signal Processor (DSP) 53. It is to be understood that all material disclosed hereinafter is only representing the main and important parts of the method for sampling analog signals and providing digital representation thereof and may be executed in parallel hardware design.

In the preferred embodiment of the generalized method of the present invention there is feeding Multi Input Multi Output (MIMO) system 51 with at least one analog input signal 54 and discrete correction signals 58.

At least one analog input signal 54 is the analog signal to be sampled and digitally represented by sampler 50 as digital output 59. The at least one analog input signal 54 and discrete correction signals 58 are fed to MIMO system 51.

There is MIMO system 51 providing analog monitoring outputs 55 being related to the at least one analog input signal 54 and discrete correction signals 58.

MIMO system 51 is characterized by the fact that, at least approximately, the relationship between one or more of MIMO system input signals (54 and 58) to MIMO system analog output signals 55 can be described by a model. Moreover, the model of MIMO system 51 is characterized by the fact that it cannot be easily separated into independent stages. Moreover, the model of MIMO system 51 is characterized by the fact that it cannot be broken into separate independent stages which processes one sample each time, without using memory from previous operations.

Alternatively, MIMO system 51 is characterized by the fact that the relationship between one or more of MIMO system input signals (54 and 58) to MIMO system analog output signals 55 can be described by a model having practical accurate identification algorithm. Analog output signals 55 of MIMO system 51 are analog signals that are used for monitoring the state of MIMO system 51 and therefore referred to hereinafter as analog monitoring outputs 55.

It is to be understood the model describing the MIMO system can have other equivalent or similar formulations without affecting the generalization of the present invention. Moreover, the model describing the MIMO system is not limited to the relationship between one or more of MIMO system input signals (54 and 58) to MIMO system analog output signals 55, and may include other parameters as needed.

MIMO system 51 features a combination of components selected from the group of: linear components (with or without memory), non-linear components (with or without memory), amplifiers, and delay elements. Optionally, operation of MIMO system 51 depends on a synchronization clock 56 that may be a signal featuring fixed pulse shape and frequency, or any other deterministic signal featuring frequency.

It is to be emphasized, that even in the case that operation of MIMO system 51 is time varying and thus depends on a synchronization clock 56, the MIMO system 51 operates on signals that are analog and time continuous. Moreover, MIMO system 51 outputs signals that are analog and time continuous. Hereinafter such a MIMO system is referred to as a "continuous MIMO".

There is feeding control unit 52 with analog monitoring outputs 55 and a synchronization clock 56.

Synchronization clock 56 may be a signal featuring fixed pulse shape and frequency, or any other deterministic signal or signals featuring frequency.

In an exemplary embodiment of the present invention, synchronization clock 56 is used for timing some or all of the outputs of control unit 52. The outputs of control unit 52 are discrete correction signals 58 and digital representation of the discrete correction signals 57.

There is control unit 52 implementing a negative feedback control loop by feeding MIMO system 51 with discrete correction signals 58, in order to keep at least one of the analog monitoring outputs 55 to be within a deterministic or probabilistic set of predefined constraints.

For example, control unit 52 is keeping at least one of the analog monitoring outputs 55 within a predefined desired range, or having a low power.

The discrete outputs of control unit 52, referred to as discrete correction signals 58, connected to MIMO system 51, can take a value selected from a set of few values, or alternatively a waveform selected from a set of waveforms. Preferably, the set of few values is determined such that the control unit can do its job optimally. In an exemplary embodiment, discrete correction signals 58 and the at least one analog input signal 54 may be either voltages pulse or currents pulse. Moreover, each one of the discrete correction signals 58 may take a value selected from its own set of values.

Control unit 52 is characterized by the fact that, at least approximately, the relationship between analog monitoring outputs 55 to discrete correction signals 58 can be described by a model.

It is to be understood the model describing control unit 52 can have other equivalent or similar formulations without affecting the generalization of the present invention. Moreover, the model describing control unit 52 is not limited to the relationship between analog monitoring outputs 55 to discrete correction signals 58, and may include other parameters as needed.

Control unit 52 features a combination of components selected from the group of: linear components (with or without memory), non-linear components (with or without memory), amplifiers, delay elements, decision elements which output bits as function of its input, such as comparators or analog to digital converters, digital to analog converters, and processing elements.

There is control unit 52 feeding DSP 53 with digital representation of the discrete correction signals 57

Due to MIMO system 51 that, at least approximately, having a model describing the relationship between one or more of MIMO system input signals (54 and 58) to MIMO system analog output signals 55, the digital representation of discrete correction signals 57 combined with the model of MIMO system 51 featuring useful information describing the at least one analog input signal 54.

There is DSP 53 receiving digital representation of the discrete correction signals 57 and, occasionally or within a continuous training period, DSP 53 is identifying the model of sampler 50 for creating an internal representation of the relationships between digital representation of the discrete correction signals 57 to one or more of MIMO system input signals (54 and 58). The model of sampler 50 is influenced from the model of MIMO system 51 and the model and function of control unit 52.

In an exemplary embodiment of the present invention, instead of having a separate training period, the operation of the sampler alternates between training and sampling, such that the input signal is continuously sampled, but with speed penalty.

In an exemplary embodiment of the present invention, sampler 50 is time invariant, or features small enough variation, or can be made almost time invariant by using analog or digital compensation methods such as the gain compensation described below. In this exemplary embodiment, the model of sampler 50 can be assumed known, though typically with low accuracy. In a case where the application using the results of sampler 50 does not demand higher accuracy, no training is necessary.

The identification process of the model of sampler 50 may be done according to one of the following five exemplary identification processes:

In the first exemplary identification process there is: (a) feeding known analog signal or signals to the at least one analog input signal 54 in a training period, (b) DSP 53 is reading digital representation of the discrete correction signals 57, (c) DSP 53 is identifying the model of sampler 50 by applying system identification algorithm, based on the known analog signal or signals at the at least one analog input signal 54, and the digital representation of the discrete correction signals 57. For example, well known in the art non-linear models identification algorithms based on known inputs are neural networks and Volterra series. An exemplary reference book is: Adaptive Wireless Trancievers by L. Hanzo, C. H. Wong, M. S. Yee, Wiley ISBN 0470-84689-5.

It is noted that the method of the present invention may not guarantee success in identification of every arbitrary MIMO system and control unit The MIMO system and control unit of the present invention should be selected in a way leading itself to a one to one identification. Moreover, the identification process may not identify the transfer function of sampler 50 explicitly, but identify only a relation between the digital correction signals and the input signals.

Figure 2:
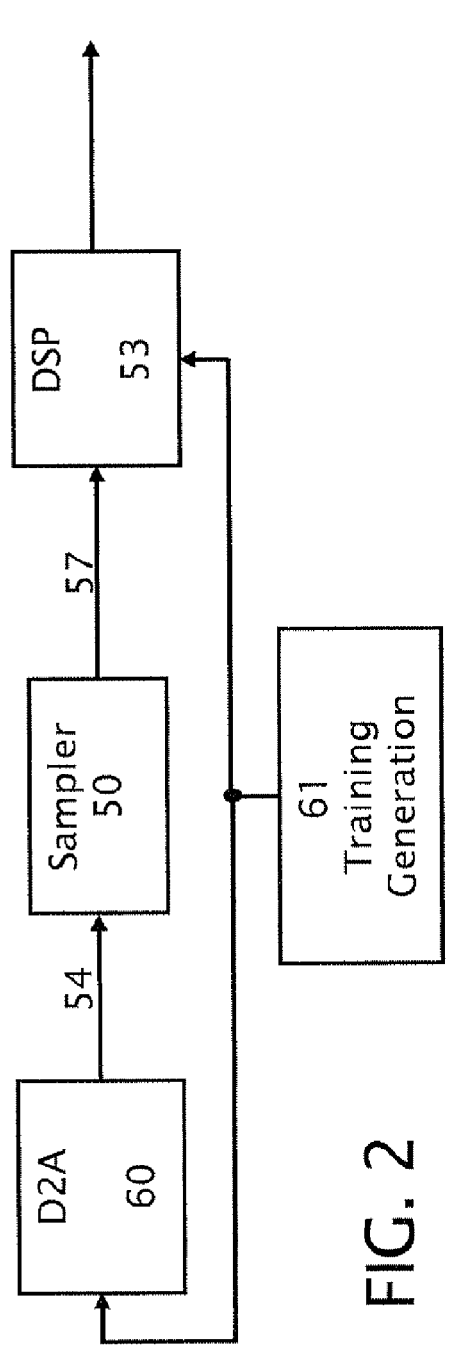
FIG. 2 is a schematic diagram illustrating an exemplary method for identifying the model of the analog signals sampler of the present invention.

The known analog signal or signals fed to the at least one analog input signal 54 may be produced by feeding known digital signals to a digital to analog converter, driving the at least one analog input signal 54, as illustrated in FIG. 2. Referring to FIG. 2, training generation unit 61 is feeding known digital signals to a digital to analog converter 60 and to DSP 53. An exemplary way of using sampler 50 on a continuous signal without disrupting its operation when feeding the known analog signal or signals to the at least one analog input signal 54 in a training period is using more than one sampler 50 and alternating between the samplers each time one of the samplers is trained.

In the second exemplary identification process, whenever there is a-priori statistical knowledge of the at least one analog input signal 54, the model of sampler 50 may be identified by applying an identification algorithm that is using the a-priori statistical information without requiring the training periods. In an exemplary embodiment, assuming sampler 50 is linear, for pulse amplitude modulation (PAM) input signal, the model of sampler 50 may be identified by applying an identification algorithm derived from the well known Busgang algorithms. An exemplary reference book is: Adaptive Filter Theory by Simon Haykin, Prentice Hall, N.J., ISBN 0-13-013236-5. In another exemplary embodiment, assuming sampler 50 is non-linear, for pulse amplitude modulation (PAM) input signal, the model of sampler 50 may be identified by applying neural networks identification algorithms.

In the third exemplary identification process, whenever the sampler is enclosed in a system performing several signal processing functions, and that system contains some information regarding the at least one analog input signal 54, that information may be sufficient for enabling an identification algorithm of the model of sampler 50, without requiring the training periods. Some exemplary systems performing several signal processing functions that may contain some information regarding the at least one analog input signal 54 are: modem, pulse shaper, equalizer, down converter, decoder, and demodulator.

Figure 3:
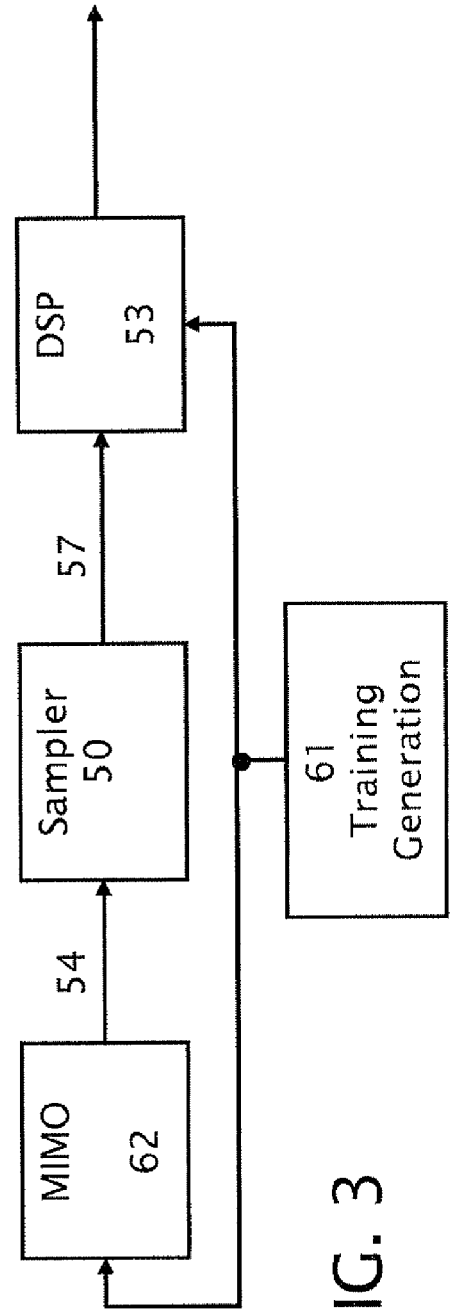
FIG. 3 is a schematic diagram illustrating an alternative exemplary method for identifying the model of the analog signals sampler of the present invention.

In the fourth identification process, as illustrated in FIG. 3 whenever an additional MIMO subsystem 62 having a system model with unknown parameters, is used for identifying the model of sampler 50, unknown parameters of both systems can be identified by joint model identification by using training generation unit 61 that is feeding known digital signals to MIMO subsystem 62 and to DSP 53

In the fifth identification process, analog input signal 54 is not used for training, and training is achieved by toggling some of the discrete correction signals 57 in a sequence generated by the DSP, and letting the control unit calculating the rest of the discrete correction signals 57. Applying an identification algorithm, for example LMS, can be used for identifying the model of sampler 50.

There is periodically repeating the identification process of the model of sampler 50 in order to update the model parameters.

Due to environmental changes, there is a need to periodically repeat the identification process of the model of sampler 50 in order to update the model parameters. Whenever sampler 50 is time invariant, there is no need to periodically repeat the identification process of the model of sampler 50 in order to update the model parameters.

Whenever the model of MIMO system 51 or the model of control unit 52 is time invariant, there is no need to periodically repeat the identification process of the model of sampler 50 in order to update the model parameters, but only repeat the identification process of the time variant model.

Whenever the model of control unit 52 is known a-priori, there is only a need to identify the model of MIMO system 51.

It is to be understood that without losing generality, the model of sampler 50 can be the inverse model describing the relationships between digital representation of the discrete correction signals 57 to one or more of MIMO system input signals (54 and 58), or alternatively, a model describing the relationships between one or more of MIMO system input signals (54 and 58) to digital representation of the discrete correction signals 57. In the last case, there is a need to inverse the model in order to reconstruct digital output signal 59.

There is DSP 53 calculating, or implicitly using in further processing, digital output signal 59 by using: digital representation of the discrete correction signals 57, the model of sampler 50, and the deterministic or probabilistic set of predefined constraints on monitoring outputs 55, wherein digital output signal 59 represents the at least one analog input signal 54.

DSP 53 is reconstructing digital output 59 (representing the at least one analog input signal 54) using digital representation of the discrete correction signals 57, the deterministic or probabilistic set of predefined constraints on monitoring outputs 55, and the model of sampler 50 (representing the relationship between input signals 54 and 58 to digital representation of the discrete correction signals 57).

In an exemplary embodiment of the present invention, digital output signal 59 is not explicitly reconstructed, but the reconstruction is combined with subsequent signal processing functions. For example, when an equalizer is applied to the signal, the equalizer can be combined with the model of sampler 50 and directly applied to digital representation of the discrete correction signals 57.

In an alternative exemplary embodiment, only a partial reconstruction is needed. For example, when only the sign of analog input signal 54 is required, it is enough to partially reconstruct analog input signal 54 by applying a simpler and less complex method featuring preservation of the sign information.

In an exemplary embodiment of the present invention, MIMO system 51 is linear MIMO system having few inputs and few outputs. One or more of the inputs are connected to the input signals to be sampled and the rest are control inputs connected to the output of a control unit. The control unit has discrete outputs connected to the control inputs of the linear MIMO system. Each one of the discrete outputs can take one of a set of few values. For example, the digital corrections can be a selection between two constants K1 and K2, or K or −K, wherein 'K' denotes a predefined value. Moreover, each control output can have its own set of values.

Hereinafter analyzed system featuring one input signal to be sampled. The gain of an output, denoted by Yj, relative to an input, denoted by Xi, of the linear MIMO system is defined as the square root of the power at the output to the power at the input:

$$\text{gain} = \sqrt{\frac{P(Yj)}{P(Xi)}}$$

where 'P' denotes average power. It is to be understood that the definition of the gain can have other equivalent or similar formulations without affecting the generalization of the present invention. The gain is measured by feeding linear MIMO system with an analog test signal at input Xi and measuring the power of the analog test signal at the desired output Yj, while: (a) all the inputs of linear MIMO system are set to zero (including the control inputs), (b) the Xi analog test signal is small enough so that any point within the system is within the linear range, (c) the Xi analog test signal features the same properties as typical analog signal at the input of the sampler, and in particular, features the same spectral properties and amplitude distribution as typical analog signal at the input of the sampler, although the test signal may have smaller amplitude.

Amax is defined as the maximum gain among all the gains of the controlled outputs of the linear MIMO system, in relation to analog input 54. The corresponding output is called the 'maximum gain output'. As disclosed below, the gain Amax is related to the number of equivalent bits of the analog signals sampler accuracy by:

$$\frac{Amax \cdot \sqrt{P(Xm(t))}}{\sqrt{P(Yj(t))}} \propto 2^{(Number\ of\ equivalent\ bits)}$$

Wherein, Yj denotes the maximum gain output, Xm(t) denotes the sampled input with the maximum allowed power to be fed to the analog signals sampler, while the sampler is working properly, i.e. the sampler is able to control the controlled outputs. For such a sampler to be useful, the number of equivalent bits of the sampler as computed by just described formula should be as high as possible.

The just described sampler provides digital representation of the analog input signal since the system is linear, the signal at the maximal gain output Yj(t) is the sum of the signals passed through the system and each correction sequence, entered in the control inputs, passing through the system. Each signal passing through the system is gaining gain of approximately Amax, and also feature some distortion, denoted by f(x(t)), where f is a linear distortion.

$$Yj(t)=r(t)+A\ max \cdot f(x(t))$$

By passing both sides of the equation through the inverse response of: A max·f (x(t)), we get:

$$\frac{f^{-1}(Y_j(t))}{Amax} = \frac{f^{-1}(r(t))}{Amax} + x(t) = e(t)$$

Wherein, r(t) denoted the sum of the responses of the system to the correction sequences, and the error signal, denoted by e(t), is bounded if Yj(t) is bounded, or the power of the error signal is bounded if the power of Yj(t) is bounded, assuming f(t) is not considerably changing the amplitude or power, respectively.

As a conclusion, reconstructing $$\frac{f^{-1}(r(t))}{Amax}$$

in DSP 53 resulting in digital representation of the signal x(t) with max error equal to the range of Yj(t) divided by Amax. It is noted that the function 'f' might not be invertible. Since it is desirable to reconstruct a sampled version of x(t) and not x(t) itself, it is sufficient to reconstruct the sampled version of x(t), and therefore to generate only $$\frac{f^{-1}(r(t))}{Amax}$$

at the sampling times.

Using the control unit for minimizing or bounding the monitor outputs or the monitor outputs power, and designing the MIMO system with sufficiently large Amax, should decrease the error of the reconstructed signal. As a conclusion, above described analog signals sampler does well represent the analog signal.

It is to be understood that sampler 50, featured components, and different positions of thereof, as illustrated in FIG. 1, is only a representative of the method and device for sampling analog signals and providing digital representation thereof, of the present invention. Multi Input Multi Output (MIMO) system 51, control unit 52, and DSP 53, may be of variable configuration, including, but not limited to, multi-stage implementation and feedback iterative implementation. Moreover, MIMO system 51 can be linear or nonlinear. For example, FIG. 4 illustrates a multi-stage configuration of sampler 50 constructed and operative for sampling at least one analog input signal 54 and providing digital representation 59 thereof, in accordance with the following accompanying method and corresponding device of the present invention. Moreover, multi-stage configuration including an iterative control may reduce the complexity of the control function by transferring the residual error to subsequent stages in each stage where the control function is successfully implemented. Moreover, the multistage architecture is highly scalable since additional stages or units can be easily added.

It is to be clearly understood that above described sampler 50 is extendable and applicable to the following description of exemplary preferred embodiments of the generalized method, along with corresponding exemplary preferred embodiments of the generalized analog signals sampler device, of the present invention, as described herein.

Herein described the first multi-stage exemplary preferred embodiment of the generalized method and corresponding analog signals sampler of the present invention. The first multi-stage exemplary preferred embodiment, as illustrated in FIG. 4, relates to a multi-stage type configuration of the sampler disclosed above in the preferred embodiment of the generalized method. The multi-stage type sampler configuration featuring a plurality of stages, each stage producing an analog monitoring output and digital representation of the discrete correction signals. A digital representation of analog input signal 54 can be obtained from the identified model of the sampler and the digital representation of the discrete correction signals produced by each stage.

Referring to FIG. 4 compared with FIG. 1, MIMO system 51 and control unit 52 are implemented in two stages (73 and 74) sampler configuration, generally noted 75, wherein an analog signal is passed through stages 73 and 74. It is to be understood that FIG. 4 illustrates schematically a two stage configuration of a multi-stage sampler in accordance with the present invention. The multi-stage sampler in accordance with the present invention is scale through duplications of stages 73 and/or 74, as is well known in the art of electronic hardware design. MIMO system 51 is implemented in FIG. 4 by MIMO systems 67 and 70. Control unit 52 is implemented at FIG. 4 by controllers 68 and 71. Analog monitoring outputs 55 are outputs 63 and 64. Discrete correction signals 58 are discrete correction signals 65 and 66. Digital representation of the discrete correction signals 57, are digital representation of the discrete correction signals 78 and 79. It is to be understood that all the disclosed method hereinafter only represents the main and important parts of the method for multi-stage sampling analog signals and providing digital representation thereof. Hereinafter disclosed method is preferably executed in parallel hardware design.

In the first set of exemplary preferred embodiments of the generalized method and corresponding analog signals sampler of the present invention there is, for each stage of sampler 75, except the first stage 73, MIMO system 70 receiving analog input signal 76 from the preceding stage and discrete correction signals 66 from its controller 71. MIMO system 67 of the first stage 73 receiving discrete correction signals 65 and analog input signal 54 to be sampled and digitally represented by sampler 75 as digital output 59. It is to be understood that each stage, when constructing sampler 75 from multi-stage elements, can be described as a general network multi-port device that its output is not only function of its input, but also function of the rest of the circuit it is connected to. The generation of a unified model from the separate stages description as multi-port electrical device is well known part of the electrical networks theory.

Analog input signal 54 is the analog signal to be sampled and digitally represented by sampler 75 as digital output 59.

There is, for each stage of sampler 75, MIMO system (67, 70) providing analog monitoring output (63, 64) being related to the input signals (54 and 65; 76 and 66), and optionally to some of or all of the rest signals in the system.

In an exemplary embodiment of the present invention, MIMO system (67, 70) of each stage is characterized by the fact that, at least approximately, the relationship between MIMO system input signals (54 and 65, 76 and 66) to MIMO system analog monitoring output signal (63, 64) can be described by a model. Alternatively, MIMO system (67, 70) of each stage is characterized by the fact that the relationship between MIMO system input signals to MIMO system analog monitoring output signal can be described by a model having practical accurate identification algorithm. MIMO system analog monitoring output signal (63, 64) is an analog signal that is used for monitoring the state of MIMO system (67, 70). It is to be understood that each analog monitoring output signal may be composed of a single signal or plurality of signals.

Alternatively, although in this embodiment the MIMO system is composed of several stages, MIMO system is characterized by the fact that its model is not made of an aggregation of multiple models of each stage. Sampler 75 features a unified model describing all of its stages. Moreover, in a case where it is possible to split the model of sampler 75 to two or more models, there are interconnections between the models and some or all of the models may remember previous values.

MIMO system (67, 70) including a combination of components selected from the group of: linear components, non-linear components, amplifiers, and delay elements.

In an exemplary embodiment of the present invention, synchronization clock 56 is applied to sampler 75. Synchronization clock 56 is used for generating time varying response of MIMO system which is often advantageous to the ability of generating the desired response, and for the control unit to generate correction that can be easily converted to digital representation and feeding to the DSP.

There is, for each stage of sampler 75, controller (68, 71) receiving analog monitoring output signal (63, 64) and a synchronization clock 56.

Synchronization clock 56 may be a signal featuring fixed pulse shape and frequency, or any other deterministic signal or signals featuring frequency. As described in the general embodiment of the present invention, synchronization clock 56 is used for timing some or all of the outputs of controllers 68 and 71.

In an exemplary embodiment of the present invention, the controller is using information from previous stages and/or later stages in order to a-priori prepare a correction to the signal entering the current stage. Moreover, a-priori correction to the signal entering the current stage can compensate for a delay in the controller operation. Moreover, information from previous stages and/or later stages can be used for better estimating the state of the current controlled MIMO system. The information from previous stages and/or later stages can be received from analog monitoring output signal (63, 64). Optional dotted line 76 is a schematic illustration of receiving analog monitoring output signal information from a previous stage.

There is, for each stage of sampler 75, controller (68, 71) providing discrete correction signals (65, 66) used for minimizing the value of the analog monitoring output (63, 64), and providing digital representation of the discrete correction signals (78,79).

Similarly to the preferred embodiment of the generalized method of the present invention, the object of the negative feedback control loop control is keeping the analog monitoring outputs within a predefined desired range.

The discrete outputs of control unit (68, 71), referred to as discrete correction signals (65, 66), performing a negative feedback control loop, can take one of a set of few values. Moreover, each one of the discrete correction signals (65, 66) may have its own set of values. Discrete correction signals (65, 66) and the analog input signals (54, 76) may be either voltages or currents. The controllers are using a negative control loop in order to control the analog monitoring outputs and keep the analog monitoring in a bounded range or in a bounded power or any other predefined criterion.

Controllers (68, 71) including a combination of components selected from the group of: linear components (with or without memory), non-linear components (with or without memory), amplifiers, delay elements, decision elements which output bits as function of its input, such as comparators or analog to digital converters, digital to analog converters, and processing elements.

There is each stage of sampler 75 producing the analog input signal (76, 77) to the following stage.

In the last stage 74 of the multi-stage type configuration of the sampler of the present invention, there may be no need to implement the negative feedback control loop because there is no need to produce analog input signal 77, although it may be used for accuracy check.

It is to be understood that for all above described exemplary implementations (illustrated in FIG. 5 and FIG. 6), the discrete correction signal can be fed back to the same cell for several iterations, or can be fed to any subsequent cell for several iterations. Moreover, the division to MIMO systems is only a logical division than can be done in additional alternative ways, all of them incorporated in the scope of the present invention. Alternative divisions are illustrated in FIG. 5A and FIG. 6A by reference numerals 91 and 92. Moreover, MIMO system can be implemented by a sample & hold circuit instead of above described capacitor and resistor without affecting the scope of the present invention.

There is DSP 53 receiving and storing digital representation of the discrete correction signals (78,79) of each stage of sampler 75.

As is well known in the art of electronic hardware design DSP 53 is storing the digital representation of the discrete correction signals (78,79) of each stage of sampler 75 in the appropriate memory referring to each analog input signal 54 to be sampled.

There is occasionally DSP 53 approximately identifying the model of sampler 75, by identifying the unknown parameters within sampler 75, for creating an internal representation of the relationship between digital representation of the discrete correction signals (78,79) to analog input signal 54.

The model of sampler 75 is influenced from the model of MIMO systems 67 and 70, and the model of control units 68 and 71. The identification process of the model of sampler 75 may be done similarly according to one of the identification processes described in the preferred embodiment of the generalized method of the present invention.

There is periodically repeating the identification process of the model of sampler 75 in order to update the model parameters.

Similarly to the disclosure at the preferred embodiment of the generalized method of the present invention, due to environmental changes, there is a need to periodically repeat the identification process of the model of sampler 75 in order to update the model parameters. Whenever sampler 75 is time invariant, there is no need to periodically repeat the identification process of the model of sampler 75 in order to update the model parameters.

Whenever the model of MIMO systems or the model of control units is time invariant, there is no need to periodically repeat the identification process of the model of sampler 75 in order to update the model parameters, but only repeat the identification process of the time variant model.

Whenever the model of the control units is known a-priori, there is only a need to identify the model of MIMO systems (67,70).

It is to be understood that without losing generality, the model of sampler 75 can be the inverse model describing the relationships between digital representation of the discrete correction signals (78,79) to analog input signal 54, or alternatively, a model describing the relationships between analog input signal 54 to digital representation of the discrete correction signals (78,79). In the last case, there is a need to inverse the model in order to reconstruct digital output signal 59.

Due to environmental changes, there is a need to periodically repeat the identification process of the model of sampler 75 in order to update the model parameters. Similarly to the preferred embodiment of the generalized method of the present invention, whenever sampler 75 is time invariant, there is no need to periodically repeat the identification process of the model of sampler 75 in order to update the model parameters.

In an exemplary embodiment of the present invention, MIMO systems are linear systems. Herein an example of identifying, by DSP 53, the model of the analog signals sampler when MIMO systems are linear systems.

There are various parameters that can change over time and environmental conditions in the sampler of the present invention. For example, the gain applied to the analog input signal at a specific stage (73, 74) is denoted as 'alfa' of that specific stage. The exact values of alfa and K parameters in the various stages is unknown. Moreover, there are parasitic influences of each stage on the neighboring stages, and clock duty-cycle variation. Just described inaccuracies affect the coefficients of the identified model of the sampler, but do not affect the linearity of the system (i.e. the system is still a linear system). The coefficients of the linear model may be estimated by standard techniques. In an exemplary embodiment, the coefficients of the linear model are estimated by the standard LMS technique, described below.

A known signal is injected by a digital-to-analog converter to the analog input of the sampler when the sampler is not in use. A random non-correlated signal is inserted at the input. The random non-correlated signal features amplitude having the range of the maximum input analog signals to the analog signals sampler of the present invention. The input and output bits are substituted into the LMS update equation. Inter-stage-interference (ISI) should be estimated too when existing.

Random input is denoted by $t(i)$, output vector (bits of the control unit, aligned in time such that all bits of $v(i)$ relates to the input sample $t(i)$) is denoted by $v(i)$, 'c' is the vector of coefficients needed to be estimated, 'e' is the error of the reconstruction of the input, and 'B' is the number of stages of the sampler. Whenever the stages feature output of one bit, the length of the vectors c and v is equal to B. 'mu' is a small coefficient controlling the rate of adaptation as is well known in the art of the LMS algorithms.

Each update of the LMS update equation is:

$$e = c' \cdot v(i) - t(i)$$

$$c = c - mu \cdot e \cdot v(i)$$

The input signal is calculated as follows:

$$x(i) = c' \cdot v(i)$$

Above training can be implemented on prior art sampler having independent stages without ISI. Such model estimation can be more accurate than the recursive stage by stage estimation that is commonly used in the field of the invention.

In an exemplary embodiment featuring ISI and DC component in the model, the LMS update equation becomes:

$$e = \text{trace}(C' \cdot V) - t + d$$

$$C = C - mu \cdot e \cdot V$$

$$d = d - mu - e$$

'C' is a matrix BxP where 'P' is the ISI length. 'V' is a matrix BxP with $v(i-P+1+q)$ to $v(i+q)$ as columns, where q is a time offset that might be needed to cover all post-cursor and precursor ISI terms. 'd' is the DC term. trace( ) is the trace of the matrix.

The input signal is reconstructed by:

$$x(i) = \text{trace}(C' \cdot V) + d$$

In order to save complexity in above described calculation, some of the entries of C that are observed to be small enough are set to zero.

In another or additional exemplary embodiment, featuring inaccurate parameters in the system, there is a need for adaptive adjustment of the gain as disclosed herein. In the system described in FIG. 5, a gain of slightly less than two is leading to stable system. There are systems that desire even lower gains to stay stable. For example, when the control unit features a delay and the correction output is applied to later stage, the gain should be substantially lower than two. However, a gain too low is leading to precision loss in the representation of the reconstructed analog signal.

In is noted that whenever the analog signals sampler is not stable, there is no point of performing the model estimation. When the analog signals sampler is stable, there is a time consuming possible operation of estimating the parameters of the sampler using for example the LMS, then calibrating the system, and then estimating the parameters again. An improved operation, that is not a replacement for the LMS since it is not accurate, but can be used for inserting the gain in its desired range is: if there is N1 '1's or '0' consecutive reduce the gain for these stages in some little step, and if there is not N2 '1's or '0' consecutive increase the gain for these stages in some little step. The process is repeated until the gain is in its desired range. In an exemplary embodiment, the output bits are monitored continuously during the operation of the sampler and the identification process is repeated as necessary. The values for N1, N2 depends on how close it is desired to be to instability, and a good value is around N1=4, N2=3. The just described algorithm is based on the observation that a sequence of same value '111 . . . ' or '000 . . . ' in the binary vector v representing the input sample (while ignoring the ISI since assuming it is sufficiently low) is not possible during stable operation. A sequence of same value indicating that the residual (i.e. the signal that is passed from stage to stage) is repeatedly tried to be controlled in each stage, but each time the residual multiplied by the gain of the stage is larger than the compensation. This is indicating that the gain is too high and instability is highly probable. In the other direction, a gain too low does not make it possible to have few bits of the same value since the correction is soon changing the sign of the residual.

There is DSP 53 reconstructing digital output signal 59 using digital representation of the discrete correction signals (78,79) and the identified model of sampler 75, wherein digital output signal 59 represents the analog input signal 54.

DSP 53 is reconstructing digital output 59 (that represents the analog input signal 54) using digital representation of the discrete correction signals (78,79) and the model of sampler 75 representing the relationships between digital representation of the discrete correction signals (78,79) to analog input signal 54. For example, in the linear case disclosed above, the input signal is reconstructed by:

$$x(i)=\operatorname{trace}(C'V)+d$$

The maximum achievable accuracy and speed performance of any analog signals sampler is limited by the non-ideal effects of its building blocks. Exemplary non-ideal effects are: settling time, finite amplifier gain, and/or analog component mismatch. When designing high-speed and high-accuracy analog signals sampler, just described non-ideal effects impose very stringent demands on the building blocks, leading to prolonged design time. Just described non-ideal effects also require the use of manufacturing processes that are optimized for component matching, thus increasing the manufacturing cost. The exemplary implementation of the first multi-stage exemplary preferred embodiment of the generalized method and corresponding analog signals sampler of the present invention disclosed below relaxes aforementioned design-requirements.

Figure 5:
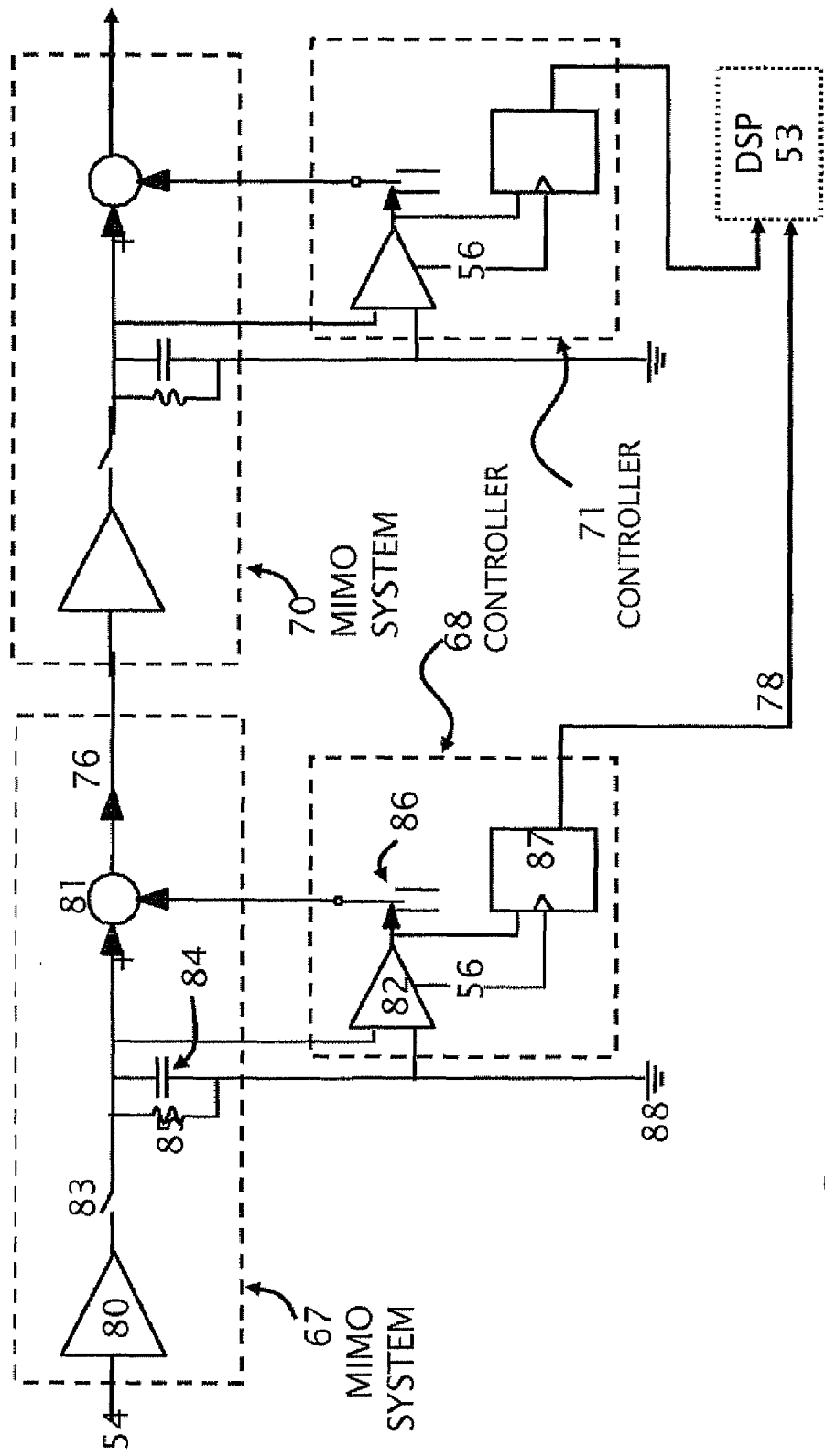
FIG. 5 is a schematic diagram illustrating an exemplary implementation of a stage, in accordance with the multi-stage exemplary preferred embodiments of the generalized method and corresponding analog signals sampler of the present invention.
Figure 5A:
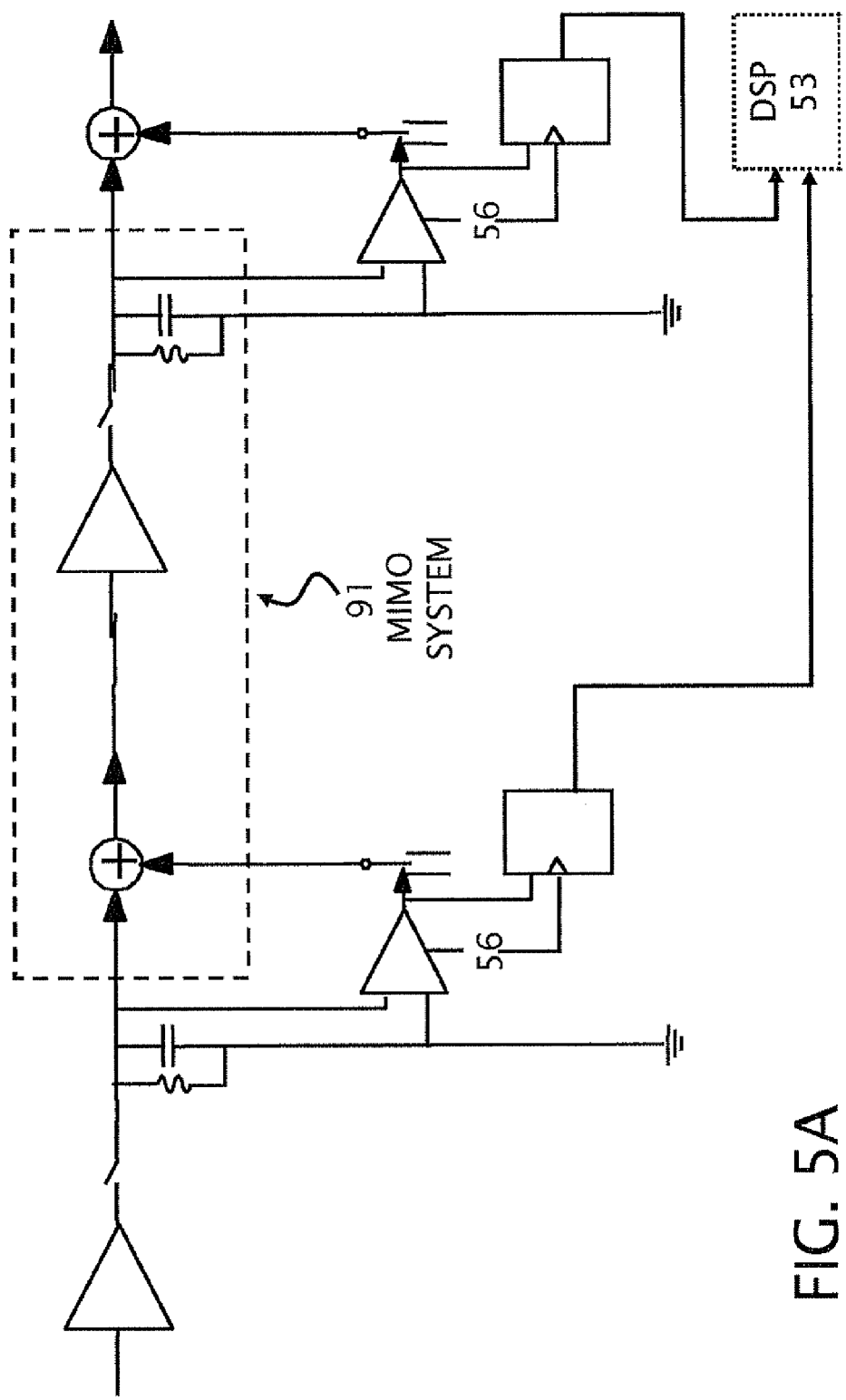
FIG. 5A is a schematic diagram illustrating an alternative division for a MIMO system in a stage.

In an exemplary implementation of the first multi-stage exemplary preferred embodiment of the generalized method and corresponding analog signals sampler of the present invention, an analog signal is passed through a series stages including MIMO and control systems, wherein each stage is implemented as illustrated in FIG. 5. In each stage the signal is amplified, sampled, compared with a threshold and according to the result of the comparison, a constant is subtracted or added to the amplified signal. In this exemplary implementation of the first multi-stage exemplary preferred embodiment, single ended implementation is used for clarity. In a practical implementation, a differential circuit is preferred.

In each stage, the input analog signal 54 is amplified by amplifier 80. In an exemplary embodiment of the present invention, amplifier 80 is a transconductance amplifier (converts voltage input to current output). In an exemplary embodiment of the present invention, the amplified analog signal is approximately integrated by using capacitor 84 for the duration of switch 83 is closed. Switch 83 is closed during the low portion of synchronization clock 56 (not shown in the figure). In an alternative embodiment, amplifier 80 is switched off during the high portion of synchronization clock 56 (not shown in the figure) instead of using switch 83. Resistor 85 is used to discharge capacitor 84 during the time switch 83 is open. The circuit is designed such that the time constant of the capacitor discharge is not too small, since during that time constant the next stage is integrating. On the other hand, the circuit is designed such that the time constant of the capacitor discharge is not too long, so that the capacitor is mostly discharged at the end of the time constant. The residual voltage is summed with the next sample and is causing Inter Symbol Interference (ISI). This ISI is not desired but usually is not reducing the performance of the sampler since it can modeled and corrected for in the DSP 53.

Controller 68 is comparing the analog signal with a threshold. Whenever the result of the comparison is positive, a constant K is subtracted at voltage adder 81 by using selector 86. Otherwise, a constant K 86 is added at voltage adder 81. The subtraction or addition are effective during the high period of clock 56, or for constant part of the high period of clock 56 (for example, the second half of the high period), when the comparator is assumed to be stable. Each comparison decision provides one bit to the representation of the analog signal and stored in digital logic 87. Digital logic 87 is holding the value in its digital input until a new rising edge of synchronization clock 56 is received. Digital logic 87 is adapted to register the output of comparator 82. Digital logic 87 is sampling its digital input at the end of the high period of synchronization clock 56 when the output of comparator 82 is stable. In an exemplary embodiment, the threshold value used by comparator 82 is zero and digital logic 87 is a D-flip-flop type. The result of the amplification, integration, discharge and the integration in the next stage results in an amplification of the signal when passing from stage to stage. That amplifying factor is denoted by 'alfa'. alfa featuring a value in the interval of 1<alfa<2. alfa featuring a value of more than 2 causes the sampler to diverge. alfa featuring a value of less then 1 is not useful since the analog signal is not amplified. Neither the value of gain alfa nor the value of constant K need to be accurate since they are estimated by DSP 53.

Comparator 82 is controlling the value of the voltages that is added by the voltage adder 81 to the sampled signal. In an exemplary embodiment, the comparator is controlling a switch. The switch is choosing between two constants such as K and −K or K1 and K2 with the raising of synchronization clock 56. In an alternative exemplary embodiment, the comparator can either subtract a constant or do nothing.

Herein disclosed an operational example of two stages, illustrating the multi-stage analog signal sampler operation. During the low portion of synchronization clock 56, switch 83 is closed (or alternatively, amplifier 80 is switched on), capacitor 84 is charged with the amplifier current less the current that is wasted into resistor 85. At the rising edge of synchronization clock 56, comparator 82 is activated and measuring the polarity of the signal on capacitor 84. Comparator 82 is controlling the correction (K or −K in switch 86) that is added to the voltage during the second half period of synchronization clock 56. In that second half period of synchronization clock 56, the following stage is active. In other words, the activating timing of the amplifier and comparator of the following stage is opposite in respect to its preceding stage. During the time that the current stage is inactive, capacitor 84 is discharged close to zero to be prepared for the next sample. During that time, the amplifier of the following stage is using voltage 76 and the capacitor of the following stage is integrating. The amplifier of the following stage features extra gain in order to compensate for the decreasing voltage 76 during the integration in the capacitor of the following stage.

Figure 6:
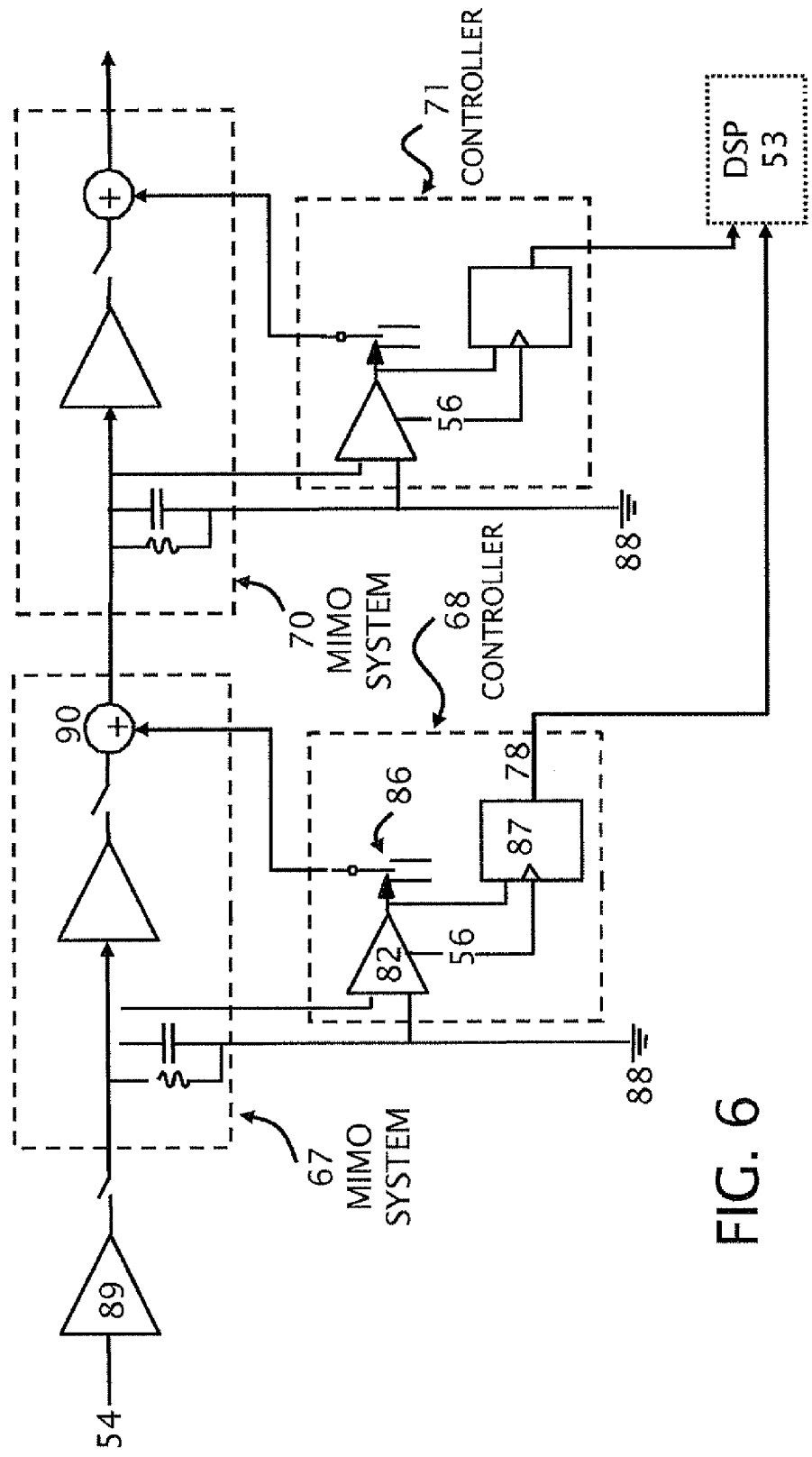
FIG. 6 is a schematic diagram illustrating an alternative exemplary implementation of a stage, in accordance with the multi-stage exemplary preferred embodiments of the generalized method and corresponding analog signals sampler of the present invention.
Figure 6A:
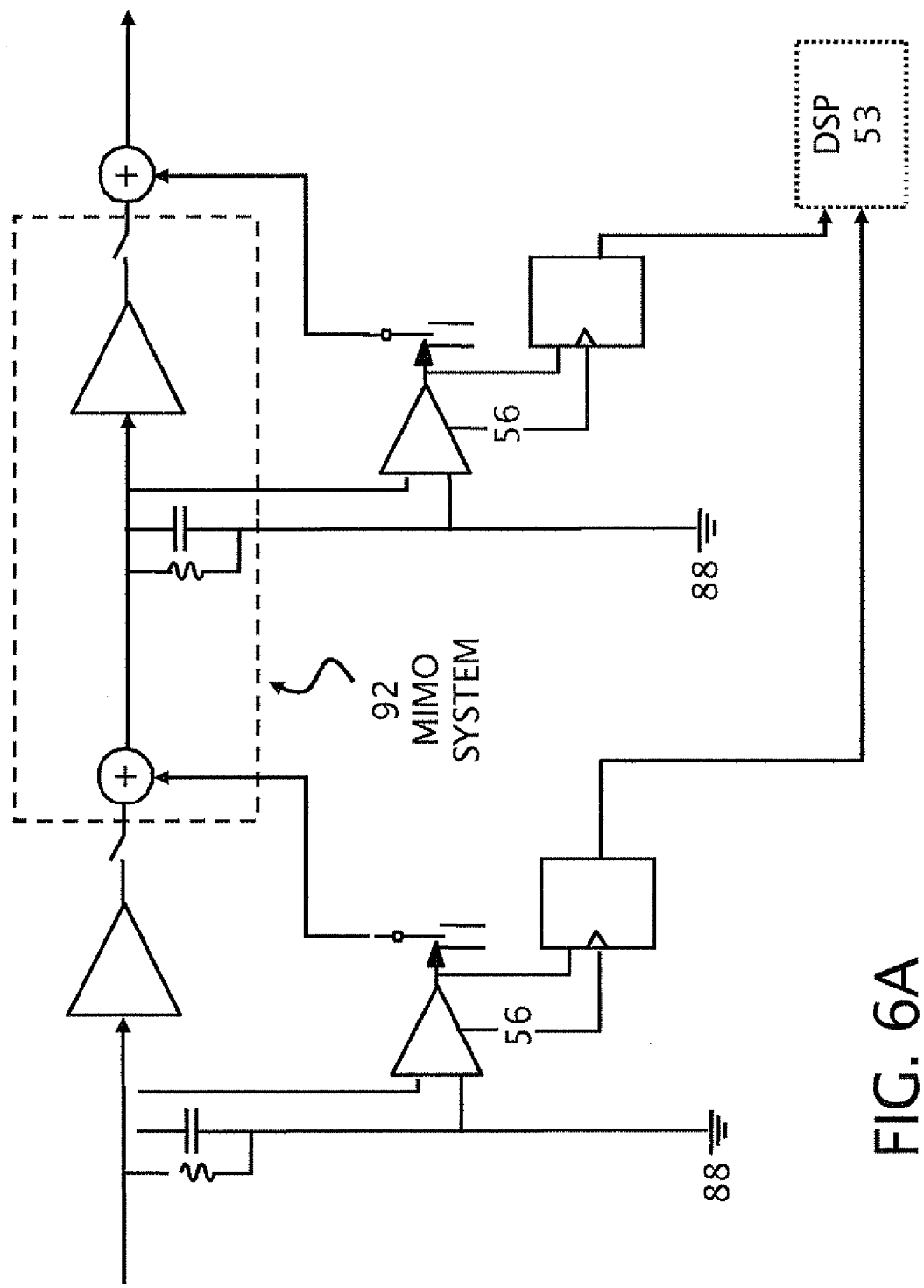
FIG. 6A is a schematic diagram illustrating an alternative division for a MIMO system in a stage.

In an alternative exemplary embodiment of the present invention, instead of generating and adding voltage as illustrated in FIG. 5, currents are generated and added as illustrated in FIG. 6. Currents are added directly at adder 90 and amplifier 89 is only a driving amplifier and does not belong to first stage 67. Except for the different circuit connections, the two exemplary embodiments illustrated in FIG. 5 and FIG. 6 are mathematically equivalent.

Herein described the second multi-stage exemplary preferred embodiment of the generalized method and corresponding analog signals sampler of the present invention. The second multi-stage exemplary preferred embodiment, as illustrated in FIG. 7, relates to a similar parallel multi-stage type embodiment of the sampler disclosed above in the first multi-stage exemplary preferred embodiment of the generalized method and corresponding analog signals sampler of the present invention. The parallel multi-stage type embodiment featuring enhances performance when dealing with external noise source. The parallel multi-stage type embodiment including a plurality of samplers featuring a plurality of stages, wherein each stage, features MIMO system and controller (67A, 70A, 68A, 71A, 67B, 70B, 68B, 71B), producing an analog monitoring output (76A, 77A, 76B, 77B) and digital representation of the discrete correction signals (78A, 79A, 78B, 79B). A digital representation of analog input signal 59' can be obtained from the identified model of the samplers and the digital representation of the discrete correction signals produced by each stage of each sampler.

Referring to FIG. 7 compared with FIG. 4, the exemplary parallel multi-stage embodiment features two multi-stage samplers (75A and 75B), wherein these two multi-stage samplers are sampling the same analog input signal 54. Each one of these two multi-stage samplers (75A and 75B), is implemented, with the required changes, in accordance with the method and corresponding device of the first multi-stage exemplary preferred embodiment described above and may incorporate all disclosed features and alternative exemplary embodiments.

In an alternative embodiment of the parallel multi-stage type, the plurality of parallel analog signal samplers are sampling at least two different analog signals. In this parallel multi-stage type embodiment, the plurality of parallel analog signal samplers are placed on the same silicon substrate, featuring crosstalk between the plurality of analog signal samplers, resulting in one system requiring a common signal processing. The common signal processing enables eliminating the crosstalk effect or decreasing its negative influence.

It is to be understood that FIG. 7 is illustrates schematically a parallel multi-stage sampler including two multi-stage samplers 75A and 75B, each one includes two stages 73 and 74. The parallel multi-stage sampler in accordance with the present invention can be scaled through duplications of its multi-stage samplers 75A and/or 75B or duplications of stages 73 and/or 74 within each multi-stage sampler, as is well known in the art of electronic hardware design.

The exemplary parallel multi-stage type embodiment, as illustrated in FIG. 7, enhances the performance of the sampler of the present invention in an environment featuring external noise source. An example for such an external noise source is noise on a power supply.

The two multi-stage samplers (75A and 75B) usually feature a crosstalk effect since they are closed by. In an exemplary embodiment of the present invention, the two multi-stage samplers are treated as one unified sampler with twice as many output bits or more, depending on the chosen multiplicity. It is assumed that an external noise source is entering all the multi-stage samplers, but due to different analog path length, the external noise source is affecting differently each multi-stage sampler. Therefore, there should be two or more representations of the same analog input signal, each representation features different added external noise. DSP 53' can cancel the added external noise whenever the added external noise is correlated. For example, $$y1=x+n \cdot b1, \; y2=x+n \cdot b2$$

are two outputs, where x is an input signal, n is an added external noise source, and b1,b2 are coefficients. The equations are solved for n using $(y2-y1)/(b2-b1)$. It is understood that having two outputs and correlated added external noise enable calculating the added external noise, and thereby cancel that calculated added external noise.

Moreover, it is understood that b1 must not be equal to b2 in order to enable this example. In the physical world, b1 should not be equal to b2 due to the randomness in the layout of the circuit, otherwise, it is possible to design the two or more multi-stage samplers slightly different in order to ensure that the add external noise is not entering with the same coefficients. Additionally, it is to be understood that there is a need for using plurality of weighting coefficients and plurality of samples of the added external noise over time since the system is not memoryless, and just for the purpose of simplifying and clearly explaining the example it is expressed with a single sample.

Thus, it is understood from the embodiments of the invention herein described and illustrated, above, that the method and corresponding device for sampling analog signals and providing digital representation thereof, of the present invention, are novel and neither anticipated or obviously derived from the previous art.

Moreover, implementation of the present invention results in significantly increasing the throughput, reducing consumed power, and increasing resolution of known in the art analog signals samplers.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination.

It is to be understood that the present invention is not limited in its application to the details of the order or sequence of functions of operation, or operations, or implementation of the method for sampling analog signals and providing digital representation thereof or to the details of construction, arrangement, and, composition of the corresponding analog signals sampler thereof, set in the description, drawings, or examples of the present invention.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

While the invention has been described in conjunction with specific embodiments and examples thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. A method for providing a digital output signal representing at least one analog input signal, comprising:
   (a) feeding an analog circuit with said at least one analog input signal and a plurality of discrete correction signals;
   (b) said analog circuit providing analog monitoring outputs,
   wherein said at least one analog input signal and said discrete correction signals are jointly related by a relationship to said analog monitoring outputs, said relationship having an identification algorithm;
   (c) receiving said analog monitoring outputs and a synchronization clock and implementing a negative feedback control loop by said feeding said analog circuit with said discrete correction signals, in order to keep at least one of said analog monitoring outputs to be within a previously defined constraint;
   (d) identifying said relationship thereby creating an internal representation of said relationship;
   (e) calculating said digital output signal by using a digital representation of said discrete correction signals and said internal representation, wherein said digital output signal represents said at least one analog input signal.

2. The method of claim 1, further comprising the step of, prior to said (a) feeding:
   (f) training by inputting a plurality of known analog training signals into said analog circuit.

3. The method of claim 1, wherein said analog circuit is time varying according to said synchronization clock.

4. The method of claim 1, wherein said discrete correction signals are based on selectably either at least two previously defined values or at least two previously defined waveforms.

5. The method of claim 1, wherein said analog circuit is a linear analog circuit.

6. The method of claim 5 wherein said identifying includes a least-mean square (LMS) technique.

7. The method of claim 1, wherein said calculating is only up to a previously defined partial reconstruction of said at least one analog input signal.

8. The method of claim 1, wherein said identifying is repeated occasionally within a training period, and said identifying includes feeding at least one analog training signal during said training period.

9. The method of claim 8, wherein said at least one analog signal is produced by feeding known digital signals to a digital to analog converter, said known digital signals driving said at least one analog training signal.

10. The method of claim 8, where said identifying is performed in the background by interleaving said at least one analog input signal and said at least one analog training signal.

11. The method of claim 8, wherein said at least one analog training signal is produced by cascading said analog circuit with at least one additional analog circuit fed by a known reference signal and said identifying is of a relationship between said known reference signal and an output of said analog circuit.

12. The method of claim 1, wherein said identifying uses available statistical information about said at least one analog input signal.

13. The method of claim 1, wherein said analog circuit is a multi-stage analog circuit including a plurality of stages, the method further comprising the steps of:
   (a) for each said stage, except the first stage, receiving as input signals at least one analog signal from a preceding stage and at least one discrete correction signal;
   (b) the first stage receiving as inputs at least one discrete correction signal and at least one analog input signal;
   (c) for each said stage, providing at least one analog monitoring output,
   (d) providing, for each stage of the multi-stage analog circuit, said at least one discrete correction signal.

14. The method of claim 13, wherein operation of each stage is dependent on at least one other stage.

15. The method of claim 1, wherein at least one of said analog monitoring outputs is time continuous.

16. A multi-stage analog signals sampler, wherein each stage of the multi-stage analog signals sampler includes:
   (a) an amplifier which amplifies an input analog signal, thereby producing an amplified analog signal;
   (b) a capacitor which at least approximately integrates said amplified analog signal, thereby producing an integrated signal;
   wherein a discharge mechanism discharges said capacitor; and
   (c) a mechanism which performs a comparison of said integrated signal with at least one threshold, and adds at least one previously defined correction to said amplified analog signal, and registers an output of said comparison in a digital logic.

17. A multi-stage analog signals sampler, wherein each stage of said multi-stage analog signals sampler includes:
   (a) an amplifier amplifying an analog input signal, thereby producing an amplified analog signal;
   (b) a mechanism which renders said amplifier dependent on a synchronization clock;
   (c) a circuit which features a time constant on the order of a period of said synchronization clock, wherein said circuit modifies said amplified analog signal;
   (d) a mechanism which provides, at least one discrete correction signal to said analog input signal, by using information from at least one other said stage, wherein said at least one discrete correction signal performs a negative feedback control loop which controls said analog input signal; and (e) a mechanism which receives and stores, a digital representation of said at least one discrete correction signal.

18. The multi-stage analog signals sampler, according to claim 17, further comprising (f) a mechanism which identifies a relationship between said at least one discrete correction signal, said analog input signal and said information used in said negative feedback control loop of said multi-stage analog signals sampler, (g) a digital signal processing mechanism which calculates a digital output signal representing said analog input signal.

19. A parallel analog signals sampler, comprising a plurality of the multi-stage analog signals samplers according to claim 17, wherein the respective digital representations of the multi-stage signal samplers are output to a common digital signal processing mechanism, the parallel analog signals sampler comprising a mechanism which identifies a joint relationship between a parallel input and the parallel output of said multi-stage analog signals samplers.

20. The parallel multi-stage analog signals sampler, according to claim 19, wherein said multi-stage analog signals samplers are placed in close proximity, wherein crosstalk between said parallel analog signal samplers is included in said joint model.

* * * * *